(12) United States Patent
Curran et al.

(10) Patent No.: US 11,660,573 B2
(45) Date of Patent: May 30, 2023

(54) FILTERED FAN APPARATUS

(71) Applicant: Ice Qube, Inc., Greensburg, PA (US)

(72) Inventors: Reid Curran, North Huntingdon, PA (US); Justin Greubel, Latrobe, PA (US)

(73) Assignee: Ice Qube, Inc., Greensburg, PA (US)

( * ) Notice: Subject to any disclaimer, the term of this patent is extended or adjusted under 35 U.S.C. 154(b) by 629 days.

(21) Appl. No.: 16/724,845

(22) Filed: Dec. 23, 2019

(65) Prior Publication Data

US 2020/0206694 A1 Jul. 2, 2020

Related U.S. Application Data

(60) Provisional application No. 62/787,015, filed on Dec. 31, 2018.

(51) Int. Cl.
| | | |
|---|---|---|
| *B01D 69/10* | (2006.01) | |
| *B01D 33/72* | (2006.01) | |
| *B01D 69/08* | (2006.01) | |
| *B01D 35/30* | (2006.01) | |

(52) U.S. Cl.
CPC ............. *B01D 69/10* (2013.01); *B01D 33/72* (2013.01); *B01D 35/30* (2013.01); *B01D 69/082* (2013.01)

(58) Field of Classification Search
CPC ........ B01D 69/10; B01D 33/72; B01D 35/30; B01D 69/082; B01D 2277/20; B01D 46/12
See application file for complete search history.

(56) References Cited

U.S. PATENT DOCUMENTS 5,573,562 A * 11/1996 Schauwecker ..... B01D 46/0005
55/501
6,643,130 B1   11/2003 DeMarchis

FOREIGN PATENT DOCUMENTS

DE         3532169 A1 *  7/1987
DE    202006006441 U1 *  8/2006 ......... H05K 7/20181

* cited by examiner

*Primary Examiner* — Waqaas Ali
(74) *Attorney, Agent, or Firm* — Gabriel & Co; Andrew M. Gabriel

(57) ABSTRACT

An embodiment an apparatus, including: a housing that permits airflow there-through; an air permeable filter disposed in the housing; where the air permeable filter is angled such that it does not sit in a horizontal plane across the housing; and an attachment mechanism for securing the housing to an enclosure that houses heat generating electronics. Other embodiments are described and claimed.

11 Claims, 4 Drawing Sheets

FILTERED FAN APPARATUS

CROSS REFERENCE TO RELATED APPLICATIONS

This application claims priority to U.S. provisional patent application Ser. No. 62/787,015, having the same title and filed on Dec. 31, 2018, the contents of which are incorporated by reference herein.

FIELD

The subject matter disclosed herein relates to enclosure cooling systems and related techniques. Some of the subject matter disclosed herein relates to cooling systems mounted to the sides of an enclosure and used for cooling items within the enclosure.

BACKGROUND

Industry and manufacturing have emerged with the widespread use of enclosures for a variety of content, for example electronics or other items that require protection from the elements as well as cooling. For example, to protect these items from harsh environments, they are typically placed in sealed enclosures or work stations that permit efficient operation without the threat of being exposed to exterior contaminates including dust, residue, rain and liquids that have the potential to cause serious damage. Since the items (such as electronics or like equipment) often generate heat within the enclosure, various cooling equipment such as air conditioners, heat exchangers, in-line compressed air coolers and filtered fan systems are used to maintain required operating temperatures within the enclosure.

Certain cooling systems often treat the enclosed air only, while sealing out the potential contaminated ambient environment. In cases where the ambient air is near room temperature (70-85 degrees Fahrenheit) and when there is not a threat of rain or splashing liquids present outside the enclosure, a filtered fan system is used to maintain a constant flow of filtered ambient air through the enclosure. These systems typically are less costly than closed-looped systems and simply employ a fan which induces the cooler ambient air through a filter media into the enclosure, therefore creating a positive pressure inside the enclosure forcing the hot enclosure air out through an exhaust vent.

In addition, certain filtered fan systems have been developed in an attempt to provide added protection for the contents of the enclosure. For example, filtered fan systems that include baffles or filters, or a combination thereof, have been developed that offer some protection from the intrusion of elements, such as water, into the enclosure.

BRIEF SUMMARY

In summary, one embodiment provides an apparatus, comprising: a housing that permits airflow there-through; an air permeable filter disposed in the housing; wherein the air permeable filter is angled such that it does not sit in a horizontal plane across the housing; and an attachment mechanism for securing the housing to an enclosure that houses heat generating electronics.

In an embodiment, the air permeable filter is shaped such that it does not transit across an opening formed in the housing in a straight line. In an embodiment, the air permeable filter includes an angle. In an embodiment, the angle is about 45 degrees with respect to a horizontal plane across the housing. In an embodiment, the air permeable filter is arc shaped.

In an embodiment, the air permeable filter is secured within a filter holder. In an embodiment, an attachment mechanism is included for securing the filter holder to the housing. In an embodiment, the attachment mechanism for securing the filter holder to the housing comprises a hinge mechanism that permits one side of the filter holder to release from the housing and another side of the filter holder to be attached to the housing via the hinge mechanism. In an embodiment, the filter holder is shaped.

In an embodiment, the attachment mechanism for securing the housing to the enclosure that houses heat generating electronics comprises an attachment mechanism for attaching the housing to a filtered fan that is attached to the enclosure. In an embodiment, the attachment mechanism for securing the housing to the enclosure that houses heat generating electronics comprises an attachment mechanism for attaching the housing directly to the enclosure.

In an embodiment, the apparatus comprises a housing for an intake or an exhaust side of a filtered fan system for enclosure cooling. In an embodiment, the apparatus comprises a blower assembly disposed in the housing.

An embodiment provides a kit comprising an intake and an exhaust having some or all of the features of the various embodiments described herein. In an embodiment, the intake or the exhaust, or both, include(s) a blower assembly.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

DETAILED DESCRIPTION

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the claims, but is merely representative of those embodiments.

Reference throughout this specification to "embodiment(s)" (or the like) means that a particular feature, structure, or characteristic described in connection with the embodiment is included in at least one embodiment. Thus, appearances of the phrases "according to embodiments" or "in an embodiment" (or the like) in various places throughout this specification are not necessarily all referring to the same embodiment.

Furthermore, the described features, structures, or characteristics may be combined in any suitable manner in one or more embodiments. In the following description, numerous specific details are provided to give a thorough understanding of example embodiments. One skilled in the relevant art will recognize, however, that aspects can be practiced without one or more of the specific details, or with other methods, components, materials, etc. In other instances, well-known structures, materials, or operations are not shown or described in detail to avoid obfuscation.

The description now turns to the figures, which illustrate certain example embodiments.

Figure 1:
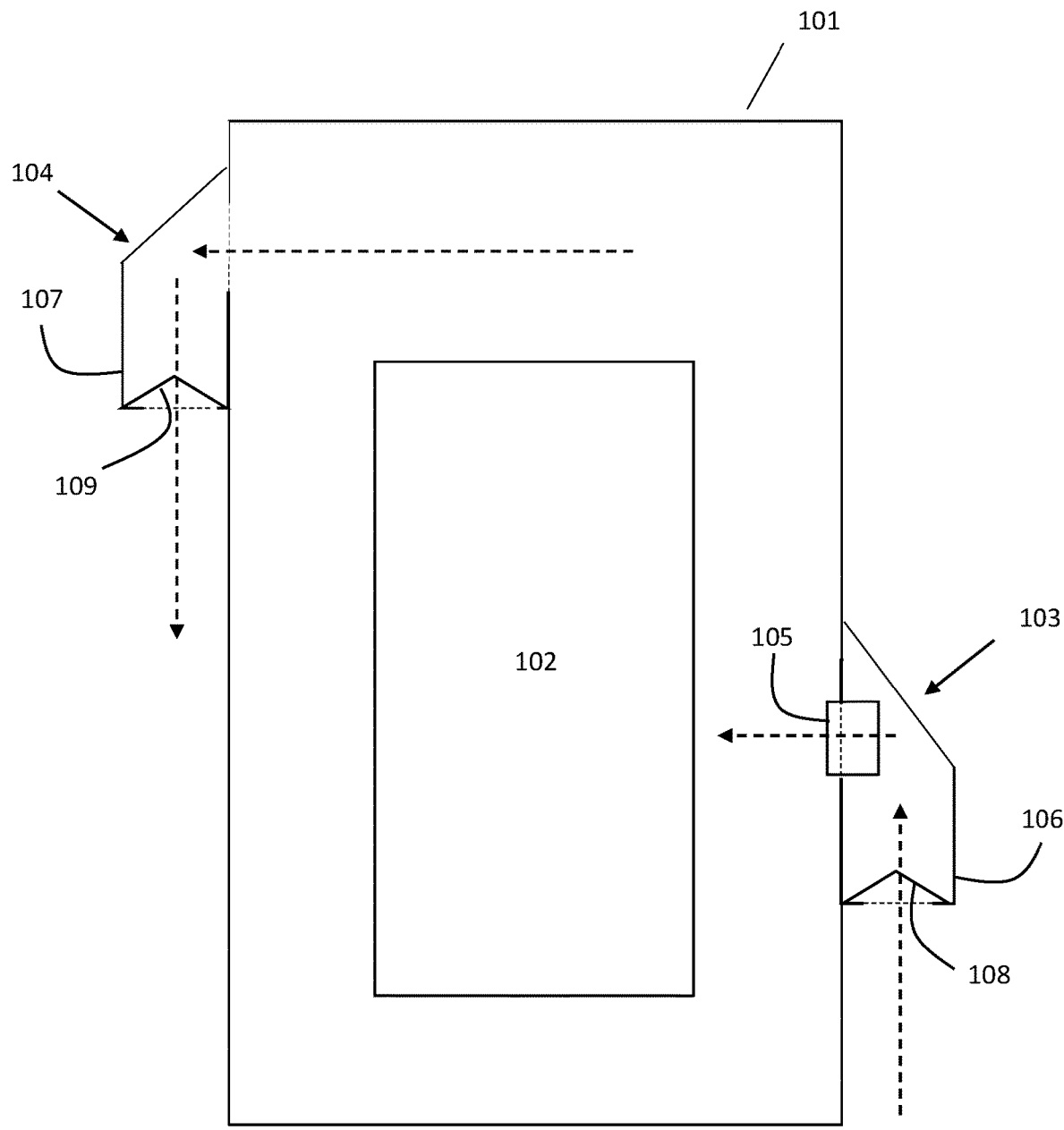
FIG. 1 illustrates a cross-sectional view of an example filtered fan apparatus mounted on an enclosure.

FIG. 1 illustrates a cross-sectional side view of a wash down filtered fan in combination with an enclosure 101 enfolding items 102 for protection from detrimental external elements. In an embodiment, the enclosure 101 may be a sealed enclosure. Conventionally, an enclosure 101 is supported above a surface by support feet (not illustrated). By way of example, items 102 such as electronics, electromechanical equipment, computers or other sensitive electronic systems (hereinafter collectively referred to as "electronics") are often housed in enclosure 101 requiring particular care with respect to harsh industrial environments, spray from water hoses used in washing operations, and outside weather conditions. Thus, residues, rain, snow and other liquids are a constant threat to items 102 such as computers and other sophisticated electronics. A wash down filtered fan apparatus in the example of FIG. 1 includes two parts, i.e., an intake 103 and an exhaust 104. Intake 103 and exhaust 104 effectively prevent any threat of water, spray, rain and/or direct pressurized water spray that may be sprayed into an intake inlet or an exhaust outlet. Intake 103 and exhaust 104 may comprise a housing constructed from a variety of materials, with stainless steel being one example.

As is shown in FIG. 1, an intake 103 is secured to the enclosure 101, for example via a plurality of nuts and bolts (not illustrated), at a first vertical surface of the enclosure 101. The intake 103 has a downwardly oriented intake inlet opening and an outlet opening that allow air to pass over air permeable filter 108 and into the enclosure 101, as illustrated with dashed arrows in FIG. 1. In an embodiment, one or more intake baffles (not illustrated) may be located upward from the intake opening and below a blower assembly 105 that is secured within intake 103. The blower assembly includes a fan or like element for inducing ambient air into intake 103 and into the enclosure 101, circulating around heat generating items 102 such as electronics for cooling purposes.

An air permeable filter 108 shown in intake 103 is removably secured to hinge mechanism (for access from below, as further described in connection with FIGS. 6-8). The air permeable filter 108 functions to screen out undesirable air borne particulate from entrance into enclosure 101. Air permeable filter 108 is inserted and removed to and from the bottom of the intake 103 for easy cleaning and replacement of air permeable filter 108.

Further illustrated in FIG. 1 is an exhaust 104, which may include the same or different components when compared to the intake 103. In the example illustrated in FIG. 1, the exhaust 104 includes all of the components of the intake 103 except the blower assembly 105. Therefore, exhaust 104 likewise includes an air inlet and outlet for channeling heated air from the inside of the enclosure 101 to ambient, as illustrated with dashed arrows in FIG. 1. The example exhaust 104 of FIG. 1 includes an air permeable filter 109, again positioned near or proximate to the bottom of the exhaust 104, which can be removed for cleaning or replacement of the air permeable filter 109.

In FIG. 1, a lower part 106 of the intake 103 and a lower part 107 of the exhaust 104 are indicated. The lower parts 106, 107 may be integral to intake 103 and exhaust 104, respectively. In an embodiment, as further described in connection with FIG. 2 and FIG. 4, intake 103 or exhaust 104 may be formed of two major components, where the lower parts 106, 107 are separate from upper parts of the intake and exhaust. Therefore, in certain embodiments, the lower parts 106, 107 may take the form of an extension part that can be added to an existing filtered fan intake or exhaust, e.g., for improving their performance with respect to intrusion of unwanted elements such as water. For example, the lower parts 106, 107 may be attached to an existing NEMA (National Electrical Manufacturers Association) 3R hood to make it a NEMA 4/4X hood.

Figure 2:
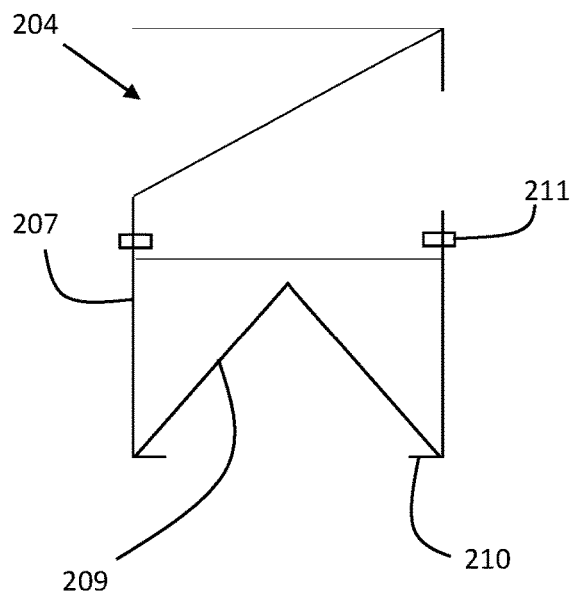
FIG. 2 illustrates a cross-sectional side view of an example filtered fan apparatus.

In FIG. 2 a side of the exhaust 204 is illustrated in a cross-sectional view. As shown, the exhaust 204 includes an air permeable filter 209 that is secured to a lower end or part 207 of the exhaust 204, using a lip 210. In an embodiment, the air permeable filter 209 is angled such that it does not sit in a horizontal plane across the housing. This permits the air permeable filter 209 to drain water more effectively. In an embodiment, the air permeable filter 209, as with permeable filters 108, 109 of FIG. 1, is provided in a predetermined shape. In the example of FIG. 2, the air permeable filter 209 has an angle of about 45 degrees with respect to a horizontal plane across the housing. In other embodiments, the shape may be different, for example a different angle or an arc shape.

The shaped filter, such as the 45-degree angle illustrated in FIG. 2, allows air permeable filter 209 to allow passage of air and at the same time facilitates shedding of water that may splash or be sprayed onto the air permeable filter 209. Additionally, the shaped filter provides more surface area, increasing the usable surface of the filter.

For each of the permeable filters 108, 109, an appropriate filter material may be selected. In an embodiment, a MERV (minimum efficiency reporting value) 6 filter may be used, e.g., as filter 108 or 109, which prohibits water from entry into an enclosure 101, even with a direct spray into the filter from a hose. Use of such a filter material in the shaped filter imparts substantial protection from intrusion of unwanted elements such as water, e.g., achieving a NEMA 4 or NEMA 4x rating. A lower flow filter such as a MERV 6 offers the highest protection against water and dust intrusion. In another embodiment, a different filter material may be used, such as a 4-micron filter used as filter 108 or 109. In another embodiment a 10-micron filter may be used as filter 108, 109. With increased pore size of the filter material, the filter 108, 109 offers greater air flow but reduced protection from intrusion of water and air borne particles.

As illustrated in FIG. 2, the lower part 207 of the exhaust 204 may be attached to the upper part thereof using a suitable securing mechanism 211, e.g., screws or bolts. In an embodiment, lower part 207 including an air permeable filter 209 may be attached to an existing filtered fan apparatus (exhaust or intake side), such that lower part 207 acts as an extension piece to improve resistance to intrusion of water or other elements.

Figure 3:
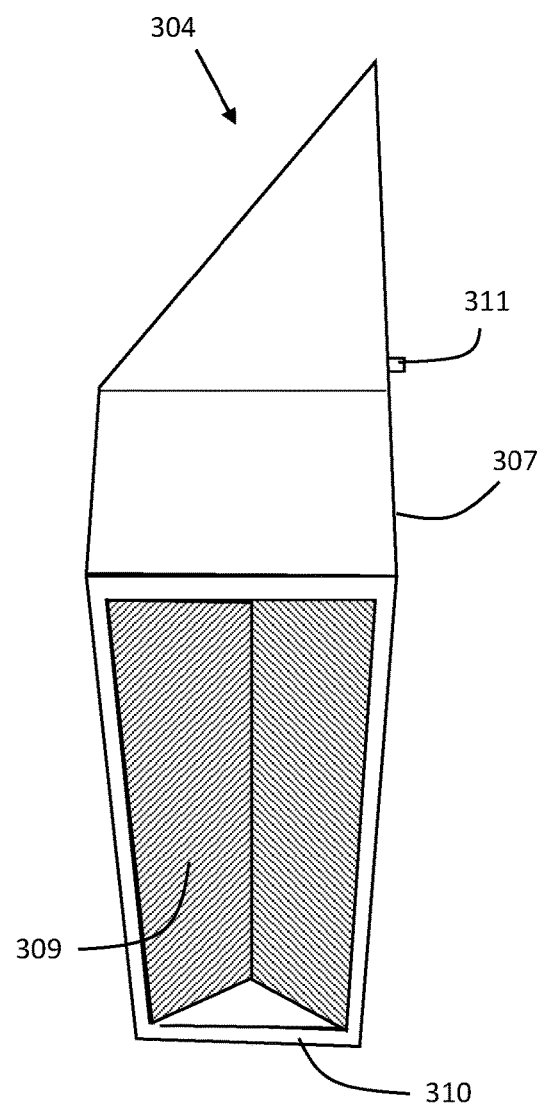
FIG. 3 illustrates a bottom-perspective view of an example filtered fan apparatus.

FIG. 3 illustrates a bottom-perspective view of the exhaust 304. In FIG. 3 the shape of the example air permeable filter 309 can be seen. The air permeable filter 309 is secured into place against the bottom lip 310 of the lower part 307 of the exhaust 304. Indicated at 311 is an attachment mechanism, for example a screw or bolt, which can act to secure the lower part 307 to the upper part (or existing filtered fan) or to secure the entire unit to the side of an enclosure, e.g., enclosure 101.

Figure 4:
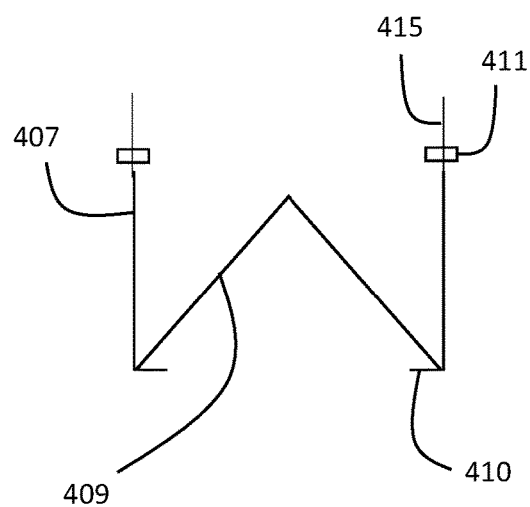
FIG. 4 illustrates a cross-sectional side view of an example filtered fan apparatus extension part.
Figure 5:
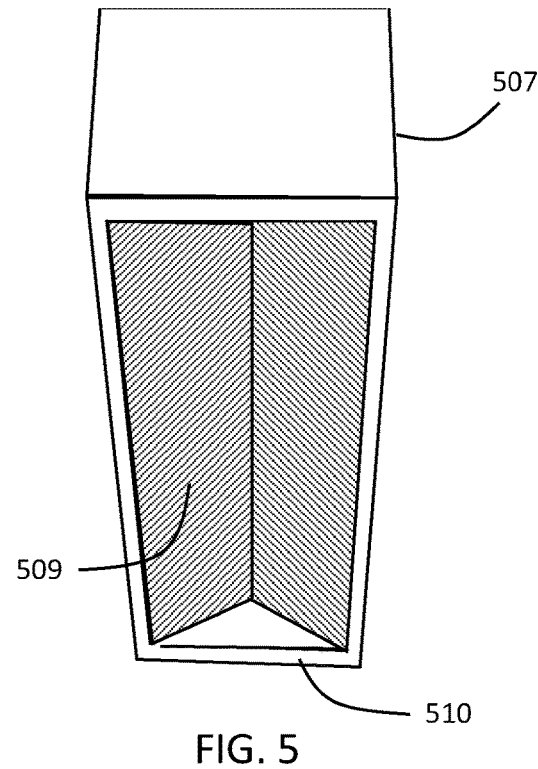
FIG. 5 illustrates a bottom-perspective view of an example filtered fan extension part.

FIG. 4 and FIG. 5 illustrate views of an example extension part. Here, the extension part is labeled using reference numerals of the exhaust side; however, some or all of the features illustrated in FIG. 4 and FIG. 5 may be included in an intake side extension part. In an embodiment, the extension part is sized to attach to existing 100 FP (fan pack), 200 FP, and 500/800 FP NEMA 3R filter hoods of Ice Qube, Inc.

As shown in FIG. 4, the extension part 407 corresponds to the lower part of the exhaust 104 of FIG. 1. Here, the shaped air permeable filter 409 is held into place against lip 410. Attachment mechanisms 411 are included on an extended side piece, one of which is labeled 415. The attachment mechanism 411 may be used to secure the extension part 407 to an existing filtered fan or to the side wall of the enclosure. A similar extension side piece and attachment mechanism may be included on the opposing side of the extension part 407 for securing the extension part 407 to an existing filtered fan apparatus or to the upper part of an embodiment that provides a complete filtered fan apparatus.

In FIG. 5 a bottom-perspective view is illustrated. Here, the extension part 507 is illustrated with air permeable filter 509 secured in the lower part by lip 510. Again, this extension part 507 may be secured to an existing filtered fan or secured to an upper part in an embodiment that provides a complete filtered fan apparatus.

FIG. 6, FIG. 6A, FIG. 7 and FIG. 8 illustrate an example attachment mechanism for securing and removing an air permeable filter in the bottom part of an embodiment.

Figure 6:
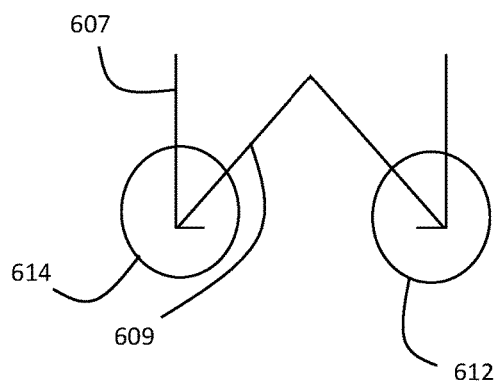
FIG. 6 illustrates a cross-sectional side view of a bottom of an example filtered fan apparatus or extension part.
Figure 6A:
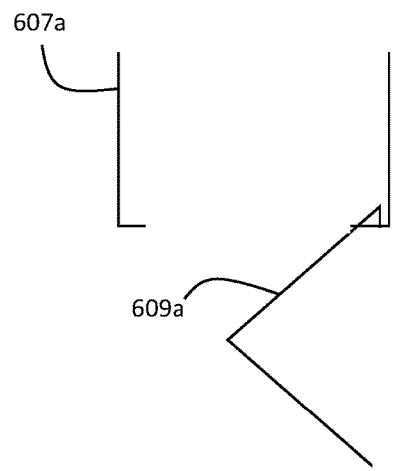
FIG. 6A illustrates a cross-sectional side view of an example filter holder rotated outward.

FIG. 6 illustrates a cross-sectional side view of a bottom of an example filtered fan apparatus or extension thereof, similar to FIG. 4. In FIG. 6, circled parts 612 and 614 are further illustrated in FIG. 7 and FIG. 8, respectively, to illustrate how air permeable fan 609 is removably secured into place. FIG. 6A illustrates an example cross-sectional side view of the air permeable filter 609a when rotated out from lower part 607a for cleaning or replacement.

Figure 7:
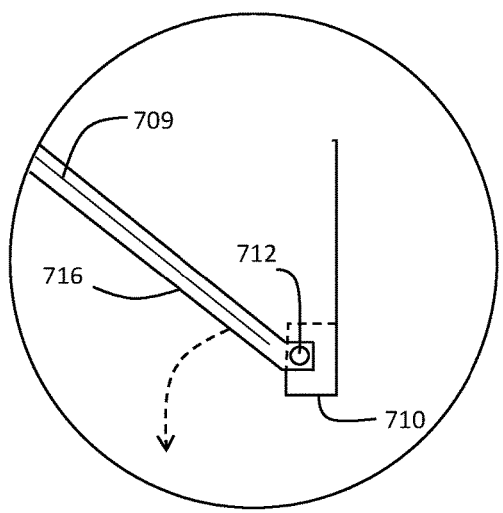
FIG. 7 illustrates a cross-sectional side view of an enlarged part of the right side of the example of FIG. 6.

FIG. 7 illustrates a cross-sectional side view of an enlarged part 612 of the right side of the example of FIG. 6. Here it is illustrated that the air permeable filter 709 is sandwiched in between an upper and a lower part of a shaped filter holder 716. The shaped filter holder 716 may include a grill or other structure to permit the passage of air into and out of the air permeable filter 709. Inclusion of a grill or like element as part of the shaped filter holder 716 permits access to the air permeable filter 709 (e.g., for cleaning or replacement) without loss of the grill or like element. The shaped filter holder 716 at one end may be secured to the lip 710 by an appropriate fastener 712, e.g., a bolt. In an embodiment, the fastener 712 permits the shaped filter holder 716 to rotate about fastener 712 similar to a hinge. That is, if the other side of the shaped filter holder (refer to 816 of FIG. 8) is loosened, it may be transitioned out of the exhaust.

Figure 8:
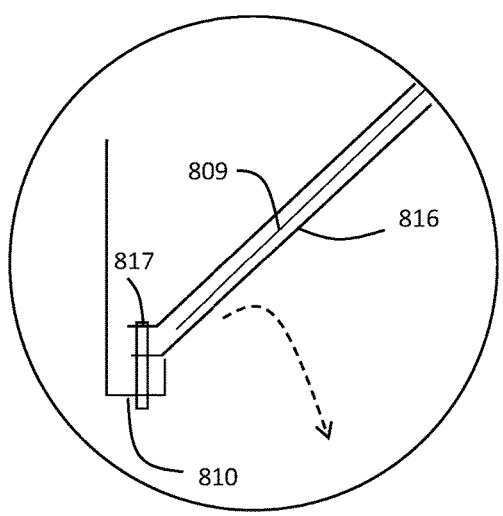
FIG. 8 illustrates a cross-sectional side view of an enlarged part of the left side of the example of FIG. 6.

FIG. 8 illustrates a cross-sectional side view of an enlarged part 614 of the left side of the example of FIG. 6. Here, the shaped filter holder 816 encloses the air permeable filter 809 and secures it to the side of the exhaust or intake at the lip 810. In this example, the shaped filter holder 816 is secured by a fastener 817, e.g., a captive screw. The shaped filter holder 816 can be removed from the lip 810 by removal of the fastener 817. This permits the end of the shaped filter holder 816 to be slid over lip 810 and out, rotating about the hinge mechanism (refer to FIG. 7).

In other embodiments, different mechanisms may hold the air permeable filter or shaped filter holder into place. For example, both sides may omit the hinge mechanism and the shaped filter holder 716, 816 may simply clip into place. Additionally, it will be understood that the shaped filter holder may be integrated with the air permeable filter, i.e., the air permeable filter may be manufactured with a border or other element that acts as the shaped filter holder. In certain embodiments, the shaped filter holder and the air permeable filter may be considered one element, e.g., if manufactured together, if a suitably rigid or formable filter material is used (and thus a separate filter holder is not needed), etc.

It is worth noting that while specific elements are illustrated in the figures, and a particular ordering or organization of elements or steps has been illustrated, these are non-limiting examples. In certain contexts, two or more elements or steps may be combined into an equivalent element or step, an element or step may be split into two or more equivalent elements or steps, or certain elements or steps may be re-ordered or re-organized or omitted as appropriate, as the explicit illustrated examples are used only for descriptive purposes and are not to be construed as limiting.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected by one skilled in the art without departing from the scope or spirit of the disclosure.

What is claimed is:

1. An apparatus, comprising:
   a housing that permits airflow there-through;
   a filter holder that attaches to the housing and has a predetermined shape selected from angled and arced;
   an air permeable filter disposed in the filter holder;
   wherein the predetermined shape of the filter holder, in a closed state, shapes the air permeable filter to be angled such that it does not sit in a horizontal plane across the housing; and
   an attachment mechanism for securing the housing to an enclosure that houses heat generating electronics a second attachment mechanism for securing the filter holder to the housing;
   wherein the second attachment mechanism for securing the filter holder to the housing comprises a hinge mechanism that permits one side of the filter holder to release from the housing and another side of the filter holder to be attached to the housing via the hinge mechanism.

2. The apparatus of claim 1, wherein the air permeable filter is shaped such that it does not transit across an opening formed in the housing in a straight line.

3. The apparatus of claim 1, wherein the air permeable filter is angled 45 degrees with respect to a horizontal plane across the housing.

4. The apparatus of claim 2, wherein the air permeable filter is arc shaped.

5. The apparatus of claim 1, wherein the attachment mechanism for securing the housing to the enclosure that houses heat generating electronics attaches the housing to a filtered fan that is attached to the enclosure.

6. The apparatus of claim 1, wherein the attachment mechanism for securing the housing to the enclosure that houses heat generating electronics attaches the housing directly to the enclosure.

7. The apparatus of claim 1, further comprising a blower assembly disposed in the housing.

8. An apparatus, comprising:
a housing that permits airflow there-through;
a filter holder that attaches to the housing and has a predetermined shape selected from angled and arced;
an air permeable filter disposed in the filter holder;
wherein the predetermined shape of the filter holder shapes the air permeable filter to be angled; and
an attachment mechanism for securing the housing to an enclosure that houses heat generating electronics second attachment mechanism for securing the filter holder to the housing;
wherein the second attachment mechanism for securing the filter holder to the housing comprises a hinge mechanism that permits one side of the filter holder to release from the housing and another side of the filter holder to be attached to the housing via the hinge mechanism.

9. The apparatus of claim 8, wherein the air permeable filter is angled 45 degrees.

10. The apparatus of claim 8, wherein the air permeable filter is arced.

11. The apparatus of claim 8, comprising a fan that moves air in one or more directions through the housing.

\* \* \* \* \*